United States Patent [19]
Ladebeck et al.

[11] Patent Number: 4,901,020
[45] Date of Patent: Feb. 13, 1990

[54] PULSE SEQUENCE FOR OPERATING A NUCLEAR MAGNETIC RESONANCE TOMOGRAPHY APPARATUS FOR PRODUCING IMAGES WITH DIFFERENT $T_2$ CONTRAST

[75] Inventors: Ralf Ladebeck; Hubertus Fischer, both of Erlangen; Franz Schmitt, Baiersdorf, all of Fed. Rep. of Germany

[73] Assignee: Siemens Aktiengesellschaft, Berlin and Munich, Fed. Rep. of Germany

[21] Appl. No.: 327,891

[22] Filed: Mar. 23, 1989

[30] Foreign Application Priority Data

May 30, 1988 [DE] Fed. Rep. of Germany ....... 3818375

[51] Int. Cl.$^4$ ............................................. G01R 33/20
[52] U.S. Cl. ..................................... 324/309; 324/307
[58] Field of Search ............... 324/300, 307, 309, 306; 128/653

[56] References Cited

U.S. PATENT DOCUMENTS

| | | | |
|---|---|---|---|
| 4,527,124 | 7/1985 | Van Uijen | 324/309 |
| 4,609,872 | 9/1986 | O'Donnell | 324/309 |
| 4,689,567 | 8/1987 | Maudsley | 324/309 |
| 4,707,658 | 11/1987 | Frahm et al. | 324/309 |
| 4,714,081 | 12/1987 | Dumoulin | 324/309 |
| 4,740,749 | 4/1988 | Yamamoto et al. | 324/309 |
| 4,825,159 | 4/1989 | Oppelt et al. | 324/309 |

FOREIGN PATENT DOCUMENTS 0232946 8/1987 European Pat. Off. .
0255220 2/1988 European Pat. Off. .

OTHER PUBLICATIONS

"Multiple-Spin-Echo Imaging With a 2D Fourier Method," Graumann et al., Magnetic Resonance in Medicine, vol. 3, pp. 707-721 (1986).
"Sodium Magnetic Resonance Imaging of Human Body," Ra et al., SMRM Book of Abstracts (1986), pp. 1462-1463.

Primary Examiner—Michael J. Tokar
Attorney, Agent, or Firm—Hill, VanSanten, Steadman & Simpson

[57] ABSTRACT

A pulse sequence is disclosed for operating a nuclear magnetic resonance tomography apparatus for producing images having different $T_2$ contrast. A signal for the gradient-echo imaging is first acquired after excitation of the nuclei subsequently, the magnetization, which is already prepared for imaging, is refocused by a 180° radio-frequency pulse, and a second echo is measured in the presence of a readout gradient. Independent images having different $T_2$ contrast can be reconstructed with the gradient echo and with the spin echo. It is thus possible to simultaneously measure a gradient echo image having a significantly lower $T_2$ contrast during the measuring time for a spin echo image.

12 Claims, 3 Drawing Sheets

PULSE SEQUENCE FOR OPERATING A NUCLEAR MAGNETIC RESONANCE TOMOGRAPHY APPARATUS FOR PRODUCING IMAGES WITH DIFFERENT $T_2$ CONTRAST

BACKGROUND OF THE INVENTION

1. Field of the Invention

The present invention relates to a pulse sequence for use in operating a nuclear magnetic resonance tomography apparatus, and in particular to such a pulse sequence for operating the apparatus to produce images with different $T_2$ contrast.

2. Description of the Prior Art

The contrast of tomograms produced in nuclear magnetic resonance tomography depending upon the relaxation times $T_1$ and $T_2$, and on the density of the substance under examination. Because the relaxation time $T_2$ is defined, inter alia, by the chemical bond of the nuclides under observation, it is of use in providing information regarding the examination subject. Images having different informational content can be produced on the basis of different $T_2$ contrast, i.e., different brightness of a picture element dependent on the corresponding $T_2$ time.

A multi-echo sequence wherein images which are $T_2$-weighted to different degrees are obtained is described in "Multiple Spin Echo Imaging With A 2d Fourier Method," Graumann et al., Magnetic Resonance in Medicine, Vol. 3, pages 707–721 (1986). The multi-echo in this method is achieved using a spin echo with at least two refocusing pulses.

A method for sodium imaging is described in "Sodium Magnetic Resonance Imaging of Human Body," Ra et al., SMRM (1986), Book of Abstracts, pages 1462–1463. A problem with this type of imaging is that sodium has extremely short $T_2$ components. To acquire these short $T_2$ components, the FID signal is first directly evaluated after a 90° pulse, and the topical resolution is undertaken using a back-projection method. After a spin echo produced by a 180° RF pulse, a signal is again read out, by which signal components having longer $T_2$ times are acquired. The same back-projection method is then used again.

SUMMARY OF THE INVENTION

It is an object of the present invention to provide a pulse sequence for operating a nuclear magnetic resonance tomography apparatus such that data for constructing images having different $T_2$ contrast are acquired after a single excitation, so that the measuring time is not lengthened.

The above object is achieved in accordance with the principles of the present invention in a pulse sequence for operating a nuclear magnetic resonance tomography apparatus wherein a first, selective radio-frequency pulse is generated together with a gradient pulse in the z-direction. These pulses function as slice selection gradients. A first gradient pulse in y-direction is then application for dephasing the spin in the y-direction. This pulse is generated simultaneously with a gradient pulse in the x-direction, having an amplitude-time integral varying from step-to-step for phase coding of the spins in the small x-direction. A second gradient pulse in the y-direction in then generated, having a directional sign opposite to the first gradient pulse in the y-direction. During this pulse, a radio signal is read-out corresponding to a first spin echo. A second radio-frequency pulse is then generated, having a flip angle of approximately 180°. A third gradient pulse y-direction having the same directional sign as the second gradient pulse in the y-direction (i.e., opposite to that of the first gradient pulse in the y-direction) is then generated, during which read-out of a second radio signal corresponding to a second spin echo is undertaken.

Using the above pulse sequence, it is possible to simultaneously measure a gradient echo image during measurement of the spin echo image. This gradient echo image has a extremely low $T_2$ contrast due to an extremely short echo time. A shortening of the measuring time is thus achieved, in comparison to known methods for generating images having different $T_2$ contrast, wherein separate data acquisition for each image is required. As a result of the simultaneous measurement in the method of the present invention, the images are independent of movement of the patient between the measurements. Moreover, in comparison to the multi-echo sequence described above, the stress on the examination subject due to radio-frequency heating is reduced, because only one 180° pulse is required for each pulse sequence.

In a further embodiment of the invention, the second gradient in the y-direction can be multiply reversed in directional sign, thereby generating further data sets corresponding to each sign reversal, so that more than two images having different $T_2$ contrast can be generated.

In a further embodiment, the method of obtaining images with different $T_2$ contrast can be combined with a known image acquisition method referred to as the echo-planar method.

DESCRIPTION OF THE PREFERRED EMBODIMENTS

Figure 1:
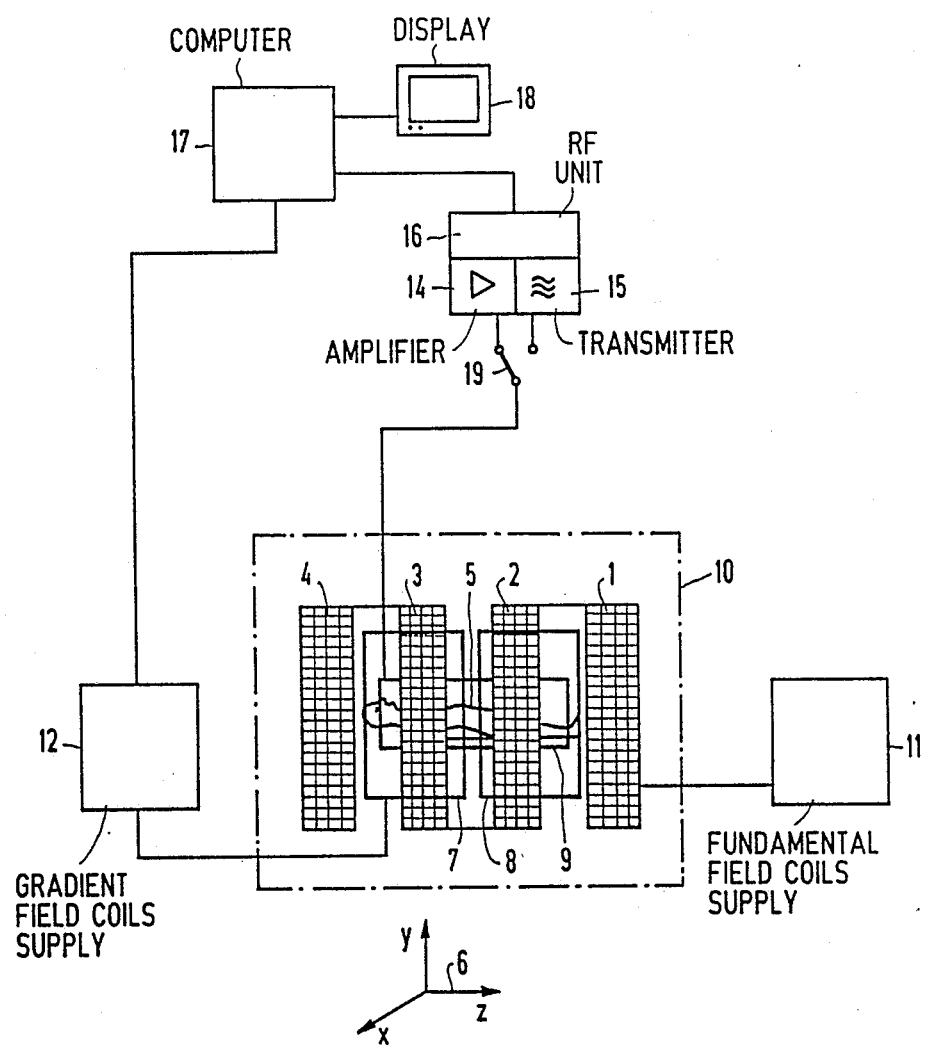
FIG. 1 is a schematic block diagram of a nuclear magnetic resonance tomography apparatus operable using the pulse sequence described in herein.

A nuclear magnetic resonance tomography apparatus, operable using the various embodiments of the pulse sequence described below, is schematically shown in FIG. 1. The apparatus includes coils 1, 2, 3 and 4 for generating a fundamental magnetic field in which, for medical diagnostics, a patient 5 to be examined in disposed. Gradient coils are also present for generating independent, orthogonal magnetic field gradients in the x, y and z directions, as indicated by the axes 6. For clarity, only the gradient coils 7 and 8 are shown in FIG. 1, which generate the x-gradient together with a pair of identical gradient coils on the opposite side of the patient 5. Similar y-gradient coils (not shown) are disposed parallel to the patient 5 above and below by patient 5. Similar z-gradient field coils (not shown) are disposed transversely to the longitudinal axis of the patient 5 at the head and feet of the patient 5.

The apparatus also includes a radio-frequency coil 9 for generating and picking up the nuclear magnetic resonance signals. The coils 1, 2, 3, 4, 7, 8 and 9 bounded by the dot-dash line 10 (plus the other gradient coils which are not shown) represent the actual examination instrument in which the patient 5 is disposed.

This instrument is operated in combination with various electrical components, including a power supply 11 for the fundamental field coils and a power supply 12 for the gradient field coils. The measuring coil 9 is connected to a process computer 17 via an RF unit 16, which includes an amplifier 14 used during signal reception, and a transmitter 15 used during signal transmission. A switch 19 connects the pick-up coil 9 to either the amplifier 14 or the transmitter 15 depending upon whether the unit is in a receiving or transmitting mode. The data acquired during the receiving mode are supplied to the computer 17, which constructs an image therefrom, which is represented on a display 18.

Figure 2:
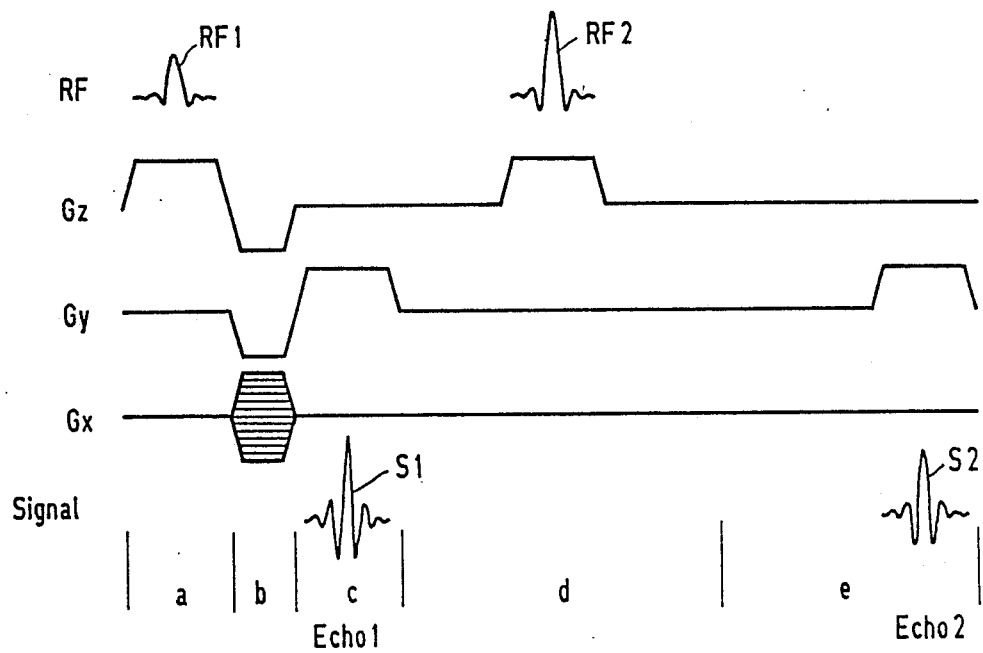
FIG. 2 is a first embodiment of a pulse sequence in accordance with the principles of the present invention.

A first embodiment of a pulse sequence in accordance with the principles of the present invention for operating the apparatus shown in FIG. 1 is shown in FIG. 2. In a first step, a radio-frequency pulse RF1 and a gradient $G_z$, are simultaneously generated and applied to the examination subject. By appropriate selection in a known manner of the frequency spectrum of the radio-frequency pulse RF1, only nuclei in a defined slice of the examination subject are selectively excited. The signal to be read out later has a maximum amplitude when the radio-frequency pulse RF1 is dimensioned so that a flip angle of 90° arises. Smaller flip angles are, however, possible. This first step is designated a in FIG. 2.

In a second step b, the gradient $G_z$, is reversed to cancel the dephasing of the spin in the z-direction produced in step a by the gradient $G_z$. Simultaneously, a negative gradient $G_y$ is applied, causing dephasing of the spin in the y-direction. A gradient $G_x$ is also simultaneously applied, which serves as a phase coding gradient in the x-direction. The overall sequence, as described again below, is multiply executed, with the amplitude of the gradient $G_x$ changing in each sequence.

In a third step c, the direction of the gradient $G_y$ in reversed so that the previous dephasing in the y-direction is canceled. A signal referred to as a gradient echo is received as a signal S1. The amplitude of the signal S1, given complete dephasing, corresponds to the FID signal. The signal S1 can thus be said to be read out under the envelope of the FID signal. This first signal S1 exhibits a relatively low $T_2$ contrast, because it is read out close to the excitation pulse.

In a fourth step d, a further radio-frequency pulse RF2 is generated simultaneously with a gradient $G_z$. The radio-frequency pulse RF2 and the gradient $G_z$ are dimensioned so that, in the exemplary embodiment of FIG. 2, the same slice is again selected as was selected in step a. Alternatively, the radio-frequency pulse RF2 could be nontopically selective, i.e., without the gradient $G_z$, and could also be alternatively have an extremely narrow bandwidth. For example, signals corresponding to fat tissue or water could thus be refocused. For this case the band width could be 300 Hz at a field strength of 2T. The radio-frequency pulse RF2 is dimensioned so that it preferably corresponds to a flip angle of 180°. The amplitude of the following read-out signal will thus be at a maximum. Deviations from a flip angle of 180° are, however, possible. A spin echo which is universally standard in nuclear magnetic resonance tomography is produced by rephasing with the radio-frequency pulse RF2 having a flip angle of approximately 180°. This spin echo is read out as a signal S2 in the following step e, under the influence of a gradient $G_y$ which functions as a read-out gradient. Because the second read-out also occurs during the spin echo, the further signal S2 is also read out under the envelope of the spin echo.

The signal S2 is significantly more heavily $T_2$-weighted because the distance (time duration) from the excitation pulse RF1 is significantly greater than that of the signal S1. The brightness difference, i.e., the contrast between picture elements having different $T_2$ time, is thus increased.

In this sequence, the magnetization which has already been prepared for the imaging is thus refocused by the radio-frequency pulse RF2, and a second echo in the form of the signal S2 is measured. This sequence permits measurement of a gradient echo image having significantly lower $T_2$ contrast simultaneously in the measuring time for a spin echo image. In contrast to the known multiple echo image described earlier, a second 180° radio-frequency pulse is not employed, and thus radio-frequency heating of the examination subject associated with such a second 180° radio-frequency pulse is not present, and problems associated with stimulated echoes are thus avoided.

A complete tomogram of the selected slice of the examination subject can now be acquired from a set of signals S1 and set of signals S2. These data sets are acquired independently of each other. For that purpose, the signals S1 and S2, upon read-out thereof, are respectively stored in the row of a memory matrix. A new row is formed for each sequence given an incremented phase coding gradient $G_x$. An image can be acquired by two-dimensional Fourier transformation from the two matrices generated in this manner. Such a suitable image acquiring method is described, for example, in U.S. Pat. No. 4,070,611. The image based on the signals S1 exhibits significantly lower $T_2$ contrast than the image based on the signals S2. Two images having different diagnostic informational content are thus obtained without lengthening the examination time.

Figure 3:
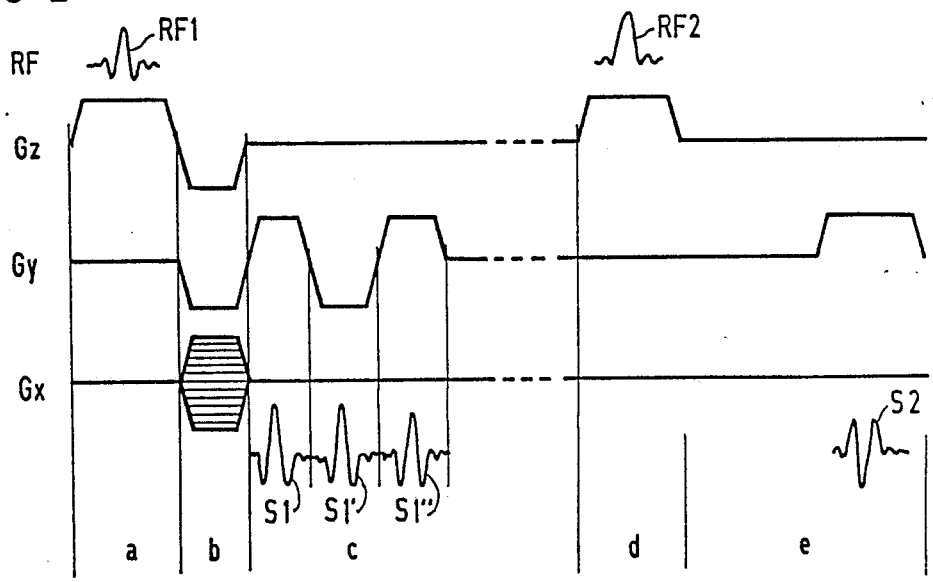
FIG. 3 is a second embodiment of a pulse sequence in accordance with the principles of the present invention.

A further embodiment of a pulse sequence in accordance with the principles of the present invention is shown in FIG. 3. This embodiment is the same as that shown in FIG. 2, with the exception the in step c the direction of the gradient $G_y$ is multiply reversed. A respective spin echo signal S1, S1' and S1" is generated with each gradient reversal. Each of these signals can be used to generate a separate image, so that more than two images having different $T_2$ contrast can be obtained.

Figure 4:
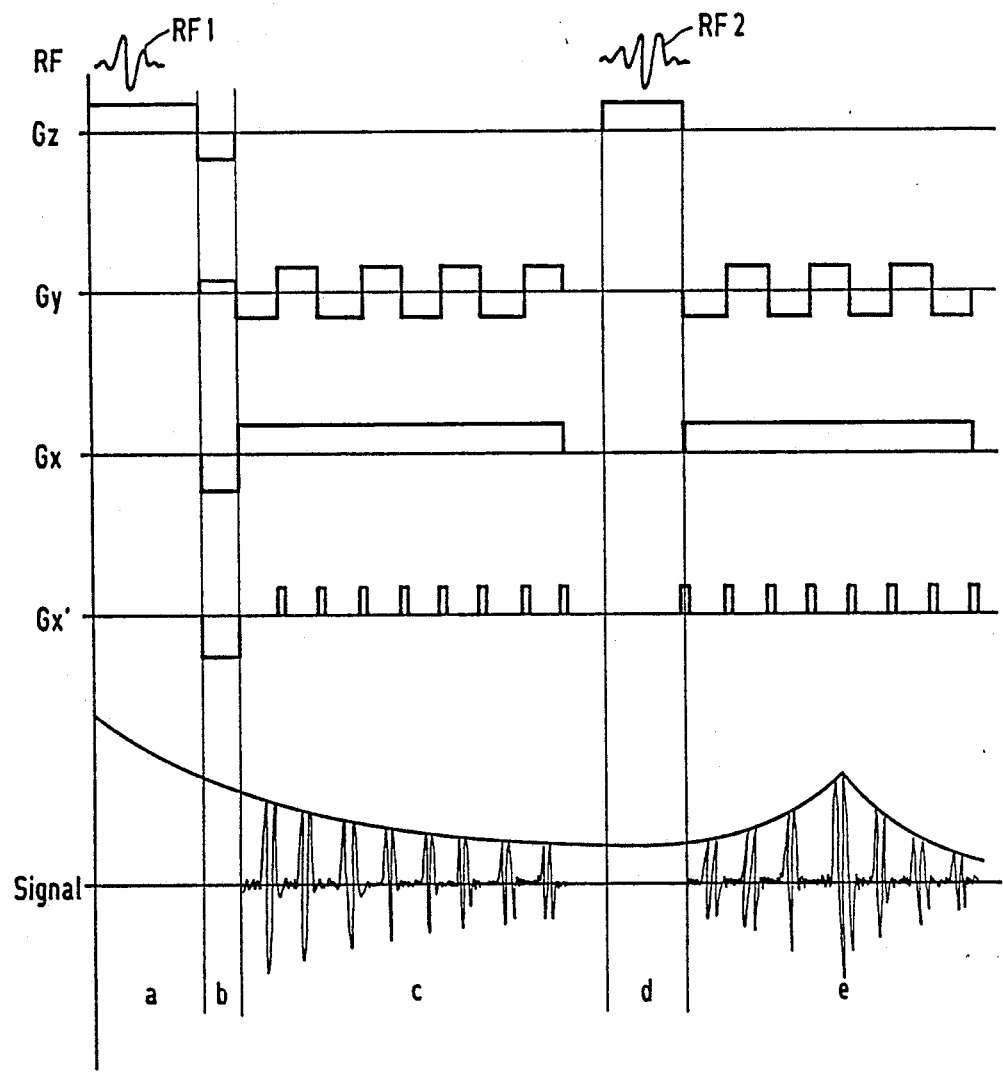
FIG. 4 is a third embodiment of a pulse sequence in accordance with the principles of the present invention.

A further embodiment of a pulse sequence is shown in FIG. 4, which employs the above-described method for obtaining images with different $T_2$ contrast in the context of the known echo-planar method of image acquisition, this known method of image acquisition being described in U.S. Pat. No. 4,451,788.

As shown in FIG. 4, a radio-frequency pulse Rf1 is generated, preferably a 90° pulse. A gradient $G_z$ is simultaneously generated, so that the radio-frequency pulse RF1 is slice-selective. In the following step b, the gradient $G_z$ is reversed to cancel the dephasing of the spin in the z-direction which occurred in step a. Simultaneously a negative gradient $G_x$ or $G_{x'}$ is generated for pre-phasing in the x-direction.

A gradient $G_y$ which is multiply inverted is applied in the following step c. A different phase is therefore impressed on the spins in the x-direction after each inversion, so that complete data for an image are obtained following an adequate number of inversions after a single radio-frequency pulse RF1. The impressing of the phase information can occur in two ways.

One possibility is to leave a weak phase coding gradient $G_x$ on during the entire read-out time. Because the amplitude-time integral of the phase coding gradient is the critical factor for the phase, the phase rotation increases with the number of gradient echoes. A further possibility is to switch a small phase coding pulse on at each gradient reversal, these phase coding pulses being referenced $G_{x'}$ in FIG. 4. The pulse length of $G_{x'}$ in the order of about 100 μsec.

After the signals for a first image are acquired step c, a second radio-frequency pulse RF2, which preferably produces a flip angle 180°, is generated in step d. A gradient $G_z$ is again switched on simultaneously, so that the radio-frequency RF2 is also frequency-selective. In step e, this radio-frequency pulse RF2 is followed by a spin echo, so that the following signals S2 are read out under the envelope of the spin echo. Again, a gradient $G_y$ having alternating polarity is again generated, so that a series of echo signals again arises.

Either a continuous phase coding gradient $G_x$ or a phase coding gradient $G_{x'}$ having individual pulses can be used given polarity change of the gradient $G_y$. The complete set of data for generating a tomogram is obtained in step e. Image reconstruction can again be undertaken by entering the signal values into a matrix, followed by two dimensional Fourier transformation. The images acquired from the signals in step c and from the signals in step e again exhibit different $T_2$ contrast, and thus have different diagnostic informational content. Each of these images has specific advantages and disadvantages. The images acquired under the envelope of the FID signal as a result of the signals in step c have higher amplitudes, but are more susceptible to inhomogeneities in the fundamental field. The signals acquired in step e under the envelope of the spin echo are less sensitive to inhomogeneities in the fundamental magnetic field, but have more heavily $T_2$-weighted images. The advantages of each type of image can be exploited, since both images are acquired in accordance with the principles of the present invention without any lengthening of the data acquisition time.

Although modifications and changes may be suggested by those skilled in the art it is the intention of the inventors to embody within the patent warranted herein all changes and modifications as reasonable and properly come within the scope with their contribution to the art.

We claim as our invention:

1. A method for generating a pulse sequence for operating a nuclear magnetic resonance tomography apparatus for producing separate images having respectively different $T_2$ contrast comprising the steps of:
   (a) generating a first, selective radio-frequency pulse simultaneously with a gradient in the z-direction as a slice selection gradient;
   (b) generating a gradient in the y-direction with a directional sign for dephasing spins in the y-direction simultaneously with a gradient in the x-direction for phase coding spins in the x-direction, said gradient in the x-direction having characteristics from which an amplitude-time integral associated with said gradient in the x-direction can be calculated;
   (c) reversing the directional sign of said gradient in the y-direction thereby generating a first radio signal, and reading out said radio signal;
   (d) generating a second radio-frequency pulse with a flip angle of approximately 180°;
   (e) generating another gradient in the y-direction having the same operational sign as in step (c) thereby generating a second radio signal, and reading-out said second radio signal;
   (f) executing steps (a) through (e) a plurality of times and varying said characteristics of said gradient in said x-direction from execution-to-execution so that said amplitude-time integral varies from execution-to-execution, said plurality of said executions resulting in a data set of said first radio signals and a data set of said second radio signals;
   (g) constructing a first image having a $T_2$ contrast from said data set of said first radio signals; and
   (h) constructing a second image having a $T_2$ contrast differing from the $T_2$ contrast of said first image from said data set of said second radio signals, said x-, y- and z-directions being orthogonal.

2. A method as claimed in claim 1, wherein step (c) is further defined by multiply reversing the directional sign of said gradient in the y-direction thereby generating a first radio signal upon each reversal of said directional sign, and reading out the respective first radio signals upon each reversal of said directional sign.

3. A method as claimed in claim 1, wherein step (d) is further defined by generating a second radio-frequency pulse which is narrow-band with a flip angle of approximately 180°.

4. A method as claimed in claim 1, wherein said second radio-frequency pulse has a bandwidth, and wherein step (d) is further defined by:
   simultaneously generating a further gradient in the z-direction as a slice selection gradient; and
   selecting said bandwidth of said second radio-frequency pulse according the selected slice thickness.

5. A method for generating a pulse sequence for operating and NMR tomography apparatus for producing separate images having respectively different $T_2$ contrast comprising the steps of:
   (a) generating a first, selective radio-frequency pulse simultaneously with a gradient in the z-direction as slice selection gradient, said gradient in the z-direction having a directional sign;
   (b) reversing the directional sign of said gradient in the z-direction for rephasing spins in the z-direction, and simultaneously generating a gradient in the x-direction for pre-phasing spins in the x-direction;
   (c) generating a gradient in the y-direction having a directional sign and multiply reversing said directional sign of said gradient in the y-direction thereby generating a first radio-frequency signal at each directional sign reversal, and reading-out the respective first radio-frequency signals after each directional sign reversal, and simultaneously generating a further gradient in the x-direction having characteristics from which an amplitude-time integral of said further gradient in the x-direction can be calculated and varying said characteristics from directional sign reversal-to-directional sign reversal of said gradient in the y-direction to increase said amplitude-time integral from directional sign reversal-to-directional sign reversal;

(d) generating a second radio-frequency pulse with a flip angle of approximately 180°;

(e) generating a further gradient in the y-direction thereby generating a second radio-frequency signal, and reading out said second radio-frequency signal;

(f) using said first radio signals to generate a first image having a $T_2$ contrast; and (g) using said second radio-frequency signal to generate a second image having a $T_2$ contrast different from said $T_2$ contrast of said first image, said x-, y- and z-directions being orthogonal.

6. A method as claimed in claim 5, wherein step (e) is further defined by said further gradient in the y-direction having a directional sign, and multiply reversing said directional sign while simultaneously generating a further gradient in the x-direction having characteristics from which an amplitude-time integral can be calculated, and varying said characteristics of said further gradient in the x-direction from directional sign reversal-to-directional sign reversal of said further gradient in the y-direction.

7. A method as claimed in claim 6, wherein step (e) is further defined by simultaneously generating said further gradient in the x-direction as a continuous gradient.

8. A method as claimed in claim 6, wherein said further gradient in the y-direction, as a result of said multiple reversals of directional sign, consists of a plurality of pulses each having a pulse length, and wherein the generation of said further gradient in the x-direction in step (e) is further defined by generating a pulse gradient in the x-direction upon each directional signal reversal of said further gradient in the y-direction, each pulse gradient in the x-direction having a pulse length substantially less than said pulse length of said further gradient in the y-direction.

9. A method as claimed in claim 5, wherein step (c) is further defined by simultaneously generating said further gradient in the x-direction as a continuous gradient.

10. A method as claimed in claim 5, wherein said further gradient in the y-direction, as a result of said multiple reversals of directional sign, consists of a plurality of pulses each having a pulse length, and wherein the generation of said further gradient in the x-direction in step (c) is further defined by generating a pulse gradient in the x-direction upon each directional signal reversal of said further gradient in the y-direction, each pulse gradient in the x-direction having a pulse length substantially less than said pulse length of said further gradient in the y-direction.

11. A method as claimed in claim 5, wherein step (d) is further defined by generating a second radio-frequency pulse which is narrow-band with a flip angle of approximately 180°.

12. A method as claimed in claim 5, wherein said second radio-frequency pulse has a bandwidth, and wherein step (d) is further defined by:

simultaneously generating a further gradient in the z-direction as a slice selection gradient; and selecting said bandwidth of said second radio-frequency pulse according the selected slice thickness.

* * * * *